United States Patent
Inaba

(12) 
(10) Patent No.: US 6,458,428 B2
(45) Date of Patent: Oct. 1, 2002

(54) LINE-TYPE FILM-FORMING METHOD

(75) Inventor: Teruaki Inaba, Shizuoka (JP)

(73) Assignee: Koito Maunfacturing Co., Ltd., Tokyo (JP)

( * ) Notice: Subject to any disclaimer, the term of this patent is extended or adjusted under 35 U.S.C. 154(b) by 0 days.

(21) Appl. No.: 09/820,866

(22) Filed: Mar. 30, 2001

(30) Foreign Application Priority Data

Mar. 31, 2000 (JP) ........................................ 2000-098858

(51) Int. Cl.$^7$ .................................................. C08J 7/18
(52) U.S. Cl. ..................... 427/491; 427/162; 427/255.3; 427/255.5; 427/404; 427/407.1
(58) Field of Search ................................. 427/491, 469, 427/162, 255.5, 255.3, 404, 407.1

(56) References Cited

U.S. PATENT DOCUMENTS

| | | | |
|---|---|---|---|
| 4,956,196 A | 9/1990 | Wagner et al. | ................. 427/38 |
| 5,130,904 A | 7/1992 | Ohshio et al. | ................. 362/61 |

FOREIGN PATENT DOCUMENTS

| | | | |
|---|---|---|---|
| JP | 10-147876 | 6/1998 | ........... C23C/16/50 |
| JP | 10-195651 | 7/1998 | ........... C23C/14/38 |

*Primary Examiner*—Bernard Pianalto
(74) *Attorney, Agent, or Firm*—Sughrue Mion, PLLC

(57) ABSTRACT

A line-type film-forming method for sequentially forming aluminum metallized films and silicone plasma polymerized protective films on a plurality of synthetic-resin base materials. The films are formed by moving a case, which houses the synthetic-resin base materials, successively in line through an aluminum metallizing chamber and a plasma polymerized film forming chamber so as to form a reflector that can be mounted in a discharge headlamp.

6 Claims, 4 Drawing Sheets

LINE-TYPE FILM-FORMING METHOD

BACKGROUND OF THE INVENTION

1. Field of the Invention

The present invention relates to a method of forming aluminum metallized films and protective films—such as silicone plasma polymerized films for protecting the aluminum metallized films—on synthetic-resin base materials through lined up processing stages.

More specifically, the invention relates to a method of forming aluminum metallized films and silicone protective films through the steps of housing and lining up, in a predetermined case, a plurality of synthetic-resin base materials for use in various reflectors—such as reflective mirrors for use in vehicular lamps such as automobiles, two-wheeled automobiles and the like, particularly synthetic-resin base materials of reflectors to be mounted in discharge headlamps—and passing the case successively through an aluminum metallizing chamber and a silicone protective film forming chamber. The invention also relates to a reflector formed by the above-described method.

2. Description of the Related Art

In the lamp chamber of a vehicular lamp—such as a headlamp to be mounted in an automobile, a two-wheeled automobile or the like—a reflector, (such as a reflective mirror) For reflecting light emitted from a light source (such as an electric bulb) to convert the light to what is emitted outside, is disposed in such a manner as to embrace the light source.

The reflector, in a substantially cup (parabolic) form, has an opening oriented to a front lens. There flector is formed with an aluminum metallized film functioning as a reflective surface on the surface layer of synthetic-resin base material mainly made of BMC (Bulk Molding Compound). Further, a protective film, for preventing deterioration of the aluminum metallized film, is formed on the surface layer of the synthetic-resin base material.

In view of environmental problems resulting from the spillage of organic solvents and attempts to reduce raw material cost, a method of forming a silicone polymerized film on each of the base materials is increasingly employed. The method uses a plasma source—by way of a high-frequency induction discharge, a glow discharge, or the like—in place of a technique of forming a protective film by coating, in order to reduce a steamy silicone oil to plasma.

However, such a method still presents the following technical problem, namely, that aluminum metallized films and plasma polymerized films are formed on both sides of synthetic-resin base materials.

First, when a 'rotating and revolving metallizing system' is used, the steps of forming aluminum metallized films and plasma polymerized films will have to be followed separately. Separate steps are necessary because the 'rotating and metallizing system' is specifically designed for forming metallized films by disposing a plurality of base materials so as to respectively face aluminum metallizing sources arranged along the central axis of a large cylindrical chamber, and then for causing the base materials to rotate on the aluminum metallizing sources. For this reason, these processing steps—for forming metallized films and for forming polymerized protective films—are multi-staged and necessitate a step of conveying the base materials when one step is shifted to the other. Moreover, as the rotating and revolving system is equipped with a rotating mechanism, as an aluminum metallizing system, it is complicated in construction.

There is also known an antenna-type plasma polymerizing system for forming aluminum metallized films and plasma polymerized films in one large chamber. In the antenna-type system, plasma is generated by way of a high-frequency oscillation antenna within a chamber so as to polymerize monomers introduced into the chamber. With the use of such a system, it is possible to form aluminum metallized films and plasma polymerized films through a series of operations.

However, the drawback of the antenna-type system is that: it is a batch production system wherein a large number of predetermined base materials are disposed in a chamber and, after a predetermined time (about 40 minutes) for forming metallized films and plasma polymerized films elapses, all of the base materials are taken out of the chamber; a lead time, necessary for disposing the base materials in the chamber is long; and when any poor quality is found in the relevant lot, many of the base materials will also be found poor in quality.

An additional problem is that the formation of plasma polymerized films by the antenna-type system results in low plasma density in general, and causes not only slow film formation but also uneven film distribution.

The aluminum metallized film sometimes is utilized as a noise shield (electromagnetic shield) when formed on the back surface of a reflector that is used in a discharge headlamp. The problem in this case is, technically, that when a plasma polymerized film (silicone polymerized film) is also formed on the aluminum metallized film on the back surface of the reflector, as in the antenna-type system, the aluminum metallized film may not be grounded.

SUMMARY OF THE INVENTION

An object of the present invention is to provide a film forming technique so devised that aluminum metallized films and plasma polymerized films are formed through a series of lined-up steps, and so that a protective film (silicone polymerized film) is not formed on the back surface of any reflector base material, whereby a protective film may easily be formed even on a reflector to be utilized in a discharge headlamp.

In order to accomplish the above and other objects, the following aspects of the invention are adopted.

In a first aspect of the invention, a plurality of synthetic-resin base materials are placed at predetermined intervals in a frame—like case via jigs. Further, an aluminum metallized film is formed on both sides of each one of the synthetic-resin base materials, and a protective film is formed on the upper layer of the aluminum metallized film, by moving the case by a conveyer, for example, successively through an aluminum metallizing chamber and a plasma polymerized film forming chamber.

With this arrangement, one only needs to install each synthetic-resin base material onto an upwardly-open case. Therefore, the work required to set the base materials can be simplified, and the lead time can also be shortened.

The steps—of forming metallized aluminum and plasma polymerized, films—that have heretofore been separately followed can now be performed in series, whereby the work of conveying synthetic-resin base materials from the aluminum metallizing stage to the plasma polymerized film forming stage can be omitted, which further shortens the lead time.

Further, because the films are formed as the case is passed laterally through an aluminum metallizing chamber and a plasma polymerized film forming chamber, a complicated mechanism for rotating base materials in any metallized-film forming unit can be dispensed with.

A preliminary vacuum chamber, for forming a low vacuum condition in preparation for the metallizing step, is provided in front of the aluminum metallizing chamber, and is kept in a high vacuum condition. Another preliminary vacuum chamber, for returning the high vacuum condition to a low vacuum condition, is provided in the rear of the plasma polymerized film forming chamber.

Moreover, because it is necessary to secure surface smoothness of each base material before the aluminum metallizing step, the surface smoothness of the base material must be secured by providing an undercoat to the synthetic-resin base material, or otherwise devising a special base material.

According to the invention, installation of the case is simplified, even when the undercoat layer is provided to each synthetic-resin base material before the aluminum metallizing step. That is, while one holds the back side (rear top portion side) of the synthetic-resin base material without touching the undercoat layer, it can be moved from the undercoat process to the case in which it will be metallized.

Incidentally, the invention is widely applicable to, for example, formation of frame-like rims, films for automotive lamp forming members, and the like, that have aluminum metallized films on their surfaces.

In a second aspect of the invention, the synthetic-resin base materials, which have sequentially been formed with aluminum metallized films and plasma polymerized films, are taken out of the case, and the empty case is conveyed to the side of the aluminum metallizing chamber whereby it can be used repeatedly.

This is convenient because the case is usable for housing, without manually moving, the synthetic-resin base materials. Although the shape and size of such a case are not restrictive, it is preferred to line up 8 or 10 synthetic-resin base materials at predetermined intervals in one case. Such case size is beneficial in consideration of the formation of aluminum metallized films facing the back surface of the respective base materials, and in consideration of the time required to set the base materials in the case.

In a third aspect of the invention, the line-type film-forming method is applied to substantially cup-shaped reflector base materials that are to be mounted in a vehicular lamp.

The cup-shaped reflector base materials include an extension reflector, for concealing the gaps between the lamp body and the reflector, and between the lamp body and the projection lens. The cup-shaped reflector base materials also include a reflector for use as are flective mirror that reflects light emitted from a bulb.

In a fourth aspect of the invention, the reflector base materials are disposed so that they are laid face down, i.e., each of its rear top portions is directed upward. The aluminum metallized film is formed on both the front surface and the back surface of each reflector base material by blowing aluminum, from below the reflector base materials, in the aluminum metallizing chamber. Further, the plasma polymerized film is formed, in the plasmapolymerized film forming chamber, on only the front surface of each reflector base material.

More specifically, pluralities of aluminum metallizing and plasma sources are arranged in the lower regions of the respective aluminum metallizing, and the plasma polymerized film forming, chambers. With respect to aluminum, a metallized film is formed on both the front surface and back surface of each reflector base material by utilizing the property of the aluminum moving around toward the back surface of the base material. In contrast, the silicone is restricted in its diffusing area, so that the silicone polymerized film is formed only on the front surface (i.e., the face directed downward) of each reflector base material.

The reflector base materials are preferably lined up at predetermined intervals to ensure that the aluminum metallized film is formed on the back surface of each reflector base material. Incidentally, by the 'opening', it is meant an opening oriented toward the front lens when the reflector is disposed in the lamp chamber; it is not the bulb mounting hole formed in the rear top portion of the reflector base material.

Because the aluminum metallized film is formed on the back surface of the reflector for the discharge headlamp, when it is formed by the line-type film-forming method according to the fourth aspect of the invention, it is ensured that an electromagnetic shielding function can be achieved. That is, since the aluminum metallized film is exposed to the back surface of the reflector, without being covered by a protective film, the back surface of the reflector can easily be grounded.

As set forth above, the invention contributes technology to improving the quality of reflectors for use vehicular lamps. In addition, the invention contributes to improvements not only in workability of forming aluminum metallized films and silicone polymerized films, but also to improvements in productivity thereof.

BRIEF DESCRIPTION OF THE DRAWINGS

The above and other objects and advantages of the present invention will become more apparent by describing in detail a preferred exemplary embodiment thereof with reference to the accompanying drawings, wherein like reference numerals designate like or corresponding parts throughout the several views, and wherein.

DETAILED DESCRIPTION OF THE PREFERRED EMBODIMENTS

1. Mode for Carrying Out the Invention

Is A preferred embodiment of the present invention will now be described with reference to the accompanying drawings.

Figure 1:
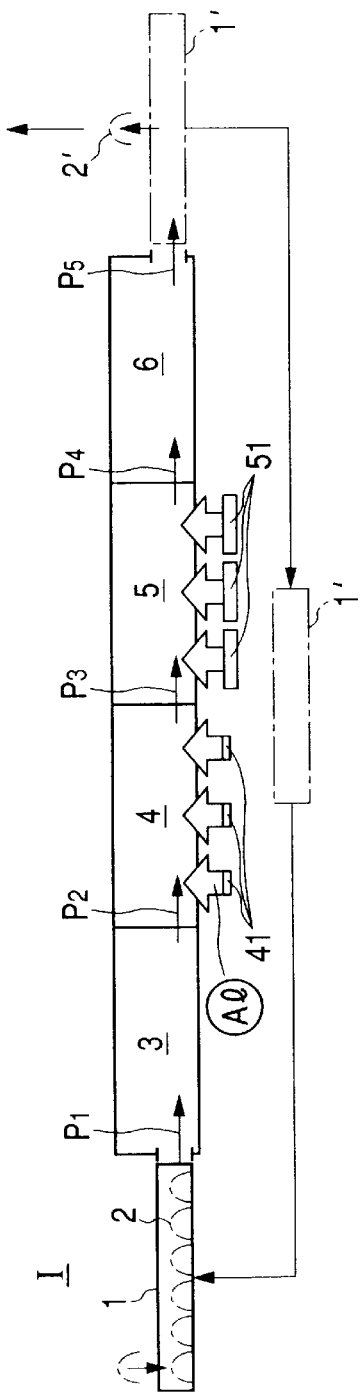
FIG. 1 is a simplified diagram illustrating the steps of forming films in a line-type method embodying the invention wherein an aluminum metallized film and a plasma polymerized film are formed on each of the synthetic-resin base materials forming a reflector.

First, FIG. 1 is a simplified diagram illustrating the steps of forming films in a line-type method embodying the invention, wherein an aluminum metallized film and a plasma polymerized film are formed on each of the synthetic-resin base materials forming a reflector to be mounted in a vehicular lamp.

With reference to FIG. 1, the steps of forming the films, according to the line-type method of the present invention, will be described. At a pretreatment step (not shown), a reflector base material 2 is formed with an undercoat layer 201 (see FIGS. 4 and 6) for securing the smoothness of the base material surface. The reflector base material 2 then is conveyed to a position I where film forming work is started.

While holding the back surface side (rear top portion side) of each reflector base material 2 with the hand, a worker manages not to touch the undercoat layer 201 with his hand. By holding the reflector base material 2 in such a manner, the worker lines up a plurality of reflector base materials 2 within a case 1 (described later) that is standing ready in the start position I. For example, the worker forms 2 lines×4 pieces=8 pieces, or 2 lines×5 pieces=10 pieces, in one case.

Figure 2:
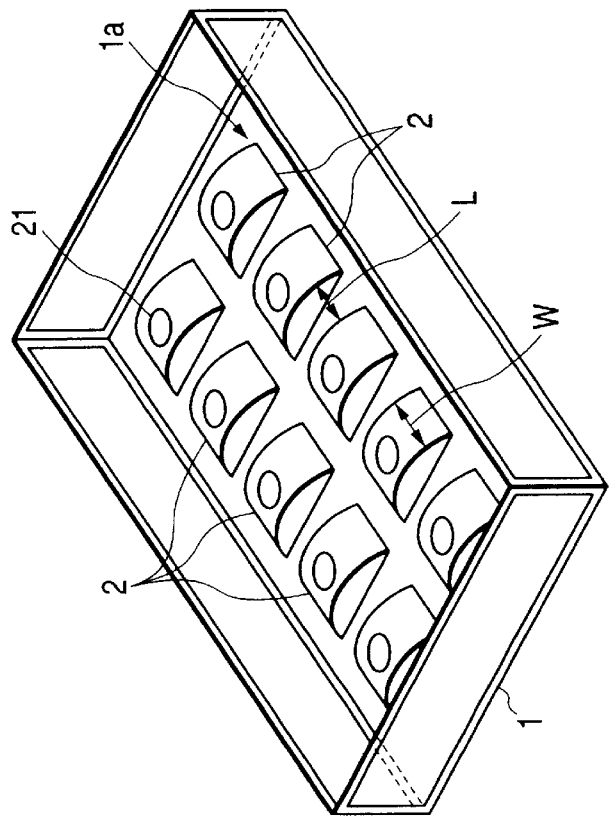
FIG. 2 is a simplified diagram illustrating the face-down reflector base materials arranged at predetermined intervals on the net-like base, of a case having a frame.

FIG. 2 is a simplified diagram illustrating the face-down reflector base materials 2 as arranged at predetermined intervals on the net-like base of the case 1. Incidentally, reference numeral 21, in FIG. 2, denotes a hole that is provided in the rear top portion of each reflector base material 2 and that is used for bulb replacement (i.e., for example, mounting by insertion).

Although the number of reflector base materials to be arranged is not particularly restricted, when the case 1 is 800 cm wide×1, 260 cm long, it is desirable to dispose therein 2 lines×4 pieces=8 pieces, or 2 lines×5 pieces=10 pieces, of the reflector base materials 2 that are sized for use in an automotive headlamp. In particular, in the case of a reflector to be used in a discharge headlamp, the present inventor has also found it desirable to set the space L between the reflector base materials 2 substantially equal to the width W of each reflector base material 2.

The reason for this spacing is that if the space L between the reflector base materials 2 thus arranged is too narrow, aluminum hardly moves around toward the back surface side 23 of each reflector base material 2 in an aluminum metallizing chamber 4, thus causing a drawback to the aluminum metallized film 401b on the back surface 23 of the reflector base material 2.

After the case 1 for housing the reflector base materials 2 is loaded with reflector base materials 2, it is conveyed by a conveyer or the like to a preliminary vacuum chamber 3 (see arrow P1 in FIG. 1). The preliminary vacuum chamber 3 is important as a preliminary step in forming the following high vacuum condition in the aluminum metallizing chamber 4.

Figure 3:
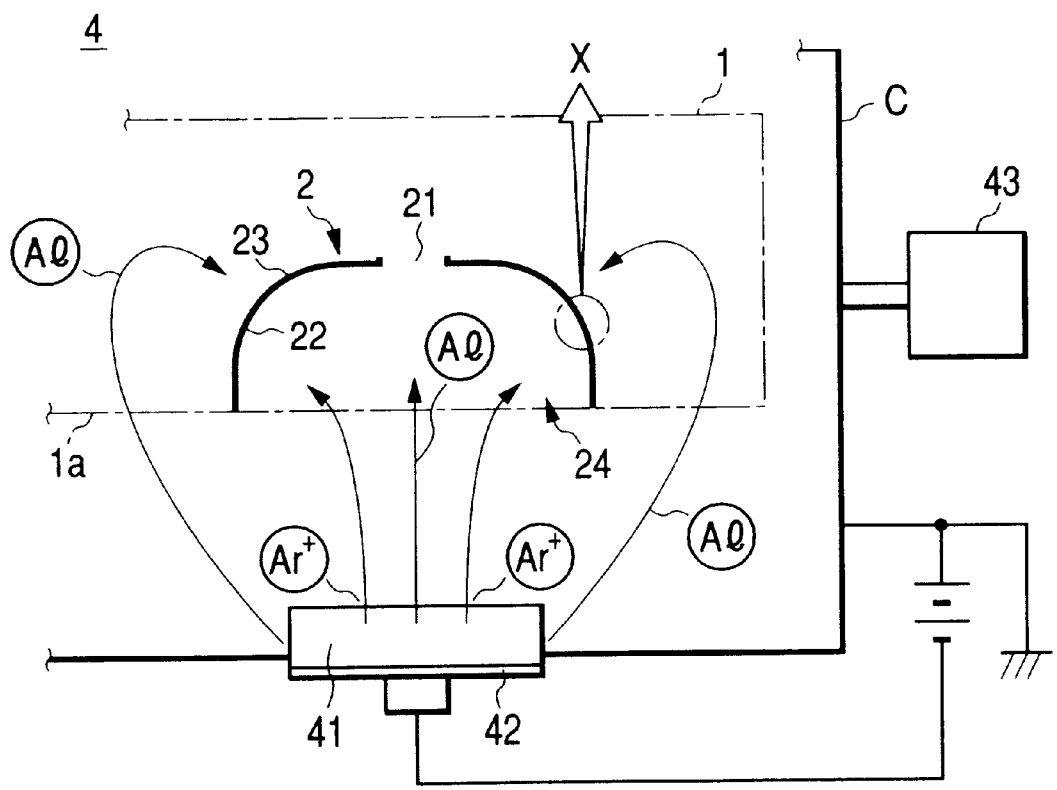
FIG. 3 is a simplified partial diagram illustrating the internal construction of the aluminum metallizing chamber.

Next, the case 1 is conveyed from the preliminary vacuum chamber 3 to the aluminum metallizing chamber 4 (see arrow P2 in FIG. 1). FIG. 3 is a simplified partial diagram illustrating the internal construction of the aluminum metallizing chamber 4 in such a state that the case 1 has been housed therein. The internal construction of the aluminum metallizing chamber 4, and the principle of aluminum metallization, will be described with reference to FIG. 3.

A vacuum chamber C coupled to a vacuum pump 43 is provided in the aluminum metallizing chamber 4. A plurality of aluminum targets 41, as resistance heating metallization sources, are disposed in the lower region of the vacuum chamber C so that the aluminum targets 41 may directly face respective reflector base materials 2 that are housed in the case 1, are conveyed to the vacuum chamber C, and are properly positioned therein.

An inactive gas (Ar gas) is introduced into the vacuum chamber C. The aluminum targets 41 set in the vacuum chamber C are heated and evaporated, so that aluminum flies out upwardly.

The aluminum thus caused to fly out comes in through the opening 24 of each reflector base material 2 and sticks onto the surface 22 thereof. Further, the aluminum moves around toward the back surface 23 of the reflector base material 2 and sticks onto the reflector base material 2. There also exists aluminum moving around toward the back surface 23 through the bulb replacement hole 21 of the reflector base material 2, and such aluminum sticks to the back surface.

Figure 4:
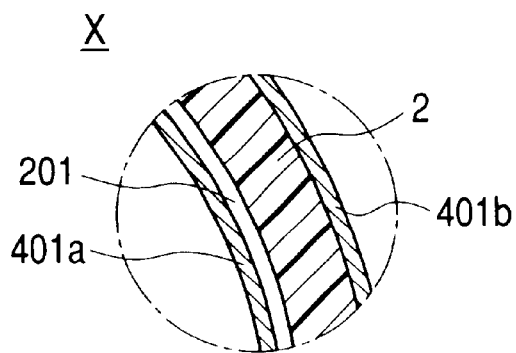
FIG. 4 is an enlarged sectional view of the base material portion shown by X in FIG. 3.

The aluminum sticking onto the reflector base material 2 results in aluminum metallized films 401a and 401b formed over the whole surface of the reflector base material 2 as shown in FIG. 4, which is an enlarged sectional view of the base material portion shown by X in FIG. 3.

By forming the aluminum metallized films 401a and 401b over the whole surface of the reflector base material 2, the aluminum metallized films 401a and 401b can effectively be shielded against the electromagnetic wave generated from the discharge lamp.

Then, the case 1 containing the reflector base materials 2—having the aluminum metallized film 401a, 401b, formed thereon—is conveyed from the aluminum metallizing chamber 4 to an adjoining plasma polymerized film forming chamber 5 (see an arrow P3 in FIG. 1).

Figure 5:
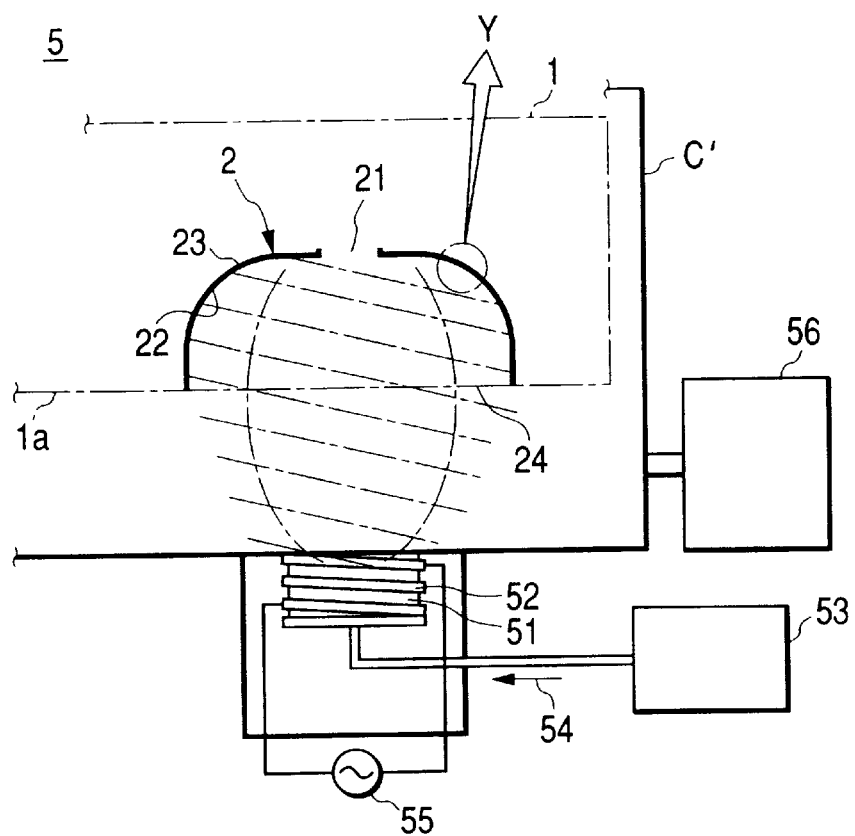
FIG. 5 is a simplified partial diagram illustrating the internal construction of the plasma polymerized film forming chamber.

FIG. 5 is a simplified partial diagram illustrating the internal construction of the plasma polymerized film forming chamber 5 in such a state that the case 1 has been housed therein. The internal construction of the plasma polymerized film forming chamber 5, and the principle of forming the plasma polymerized film, will be described with reference to FIG. 5.

The plasma polymerized film forming chamber 5 is provided with a so-called high-frequency induction discharge type radical source. More specifically, a vacuum chamber C', coupled to a vacuum pump 56, is provided. In the lower region of the vacuum chamber C' lies a plasma cell 51 having a plasma chamber (not shown) so that the plasma cell 51 may directly face each reflector base material 2 housed in the case 1.

The constitution of the radical source will now be described. A high-frequency coil 52 connected to a high-frequency power supply 55 is wound on the outer periphery of the plasma cell 51, which contains the plasma chamber. A permanent magnet, (not shown) for forming a magnetic field in parallel to the axis of the high-frequency coil 52, is provided in the rear of the base of the plasma cell 51. A silicone monomer gas 54 is introduced from a monomer tank 53 to the plasma chamber.

When the high-frequency is introduced from the high-frequency coil 52 to the plasma cell 51, discharging occurs in the plasma chamber, whereby the interior of the chamber C' becomes plasmatic. When the silicone monomer gas 54 is introduced into the plasmatic chamber C', a plasma polymerized film-protective film 501, as a uniform polymerized film, 500–6000 Angstroms thick, of crosslinked silicone is formed on the aluminum metallized layer 401a of each reflector base material 2.

With the radical source (also called a radical gun) structured as described above, a helicon wave is generated. Further, because of the Landau damping of the energy of the helicon wave, the helicon wave is efficiently transmitted to electrons within the plasma, whereby the density of the plasma generated in the plasma chamber is increased.

Figure 6:
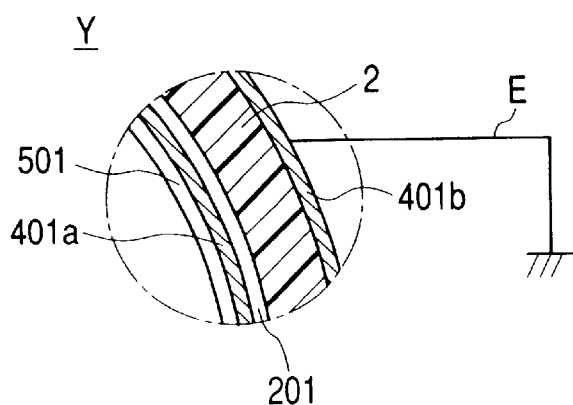
FIG. 6 is an enlarged sectional view of the base material portion shown by Y in FIG. 5.

Moreover, because the silicone monomer is introduced with directivity into the chamber C', the silicone plasma polymerized film 501 can be formed only on the upper layer of the aluminum metallized film 401a formed on the surface 22 that is directed to the lower side of the reflector base material 2 as shown in FIG. 6, which is an enlarged sectional view of the base material portion shown by Y in FIG. 5. In other words, the silicone plasma polymerized film 501 is not formed on the back surface 23 of the reflector base material 2.

Therefore, the aluminum metallized film 401b on the back surface 23 of the reflector base material 2 is directly exposed to the outside. Hence, the aluminum metallized film 401b can be grounded E (see FIG. 6). Consequently, a reflector 10, which will be described later, is suitable for a discharge headlamp.

Referring to FIG. 1 again, the case 1—housing the reflector base materials 2 formed with the respective silicone plasma polymerized films 501 in the plasma polymerized film forming chamber 5—is conveyed to a preliminary vacuum chamber 6 adjacent to the plasma polymerized film forming chamber 5 (see arrow P4 in FIG. 1). The preliminary vacuum chamber 6 is used to return the high vacuum condition, in the plasma polymerized film forming chamber 5, to a low vacuum condition. Thus, the preliminary vacuum chamber 6 is important, as a preliminary step, in taking out the case 1 under external atmospheric pressure.

After being subjected to treatment for a predetermined period of time in the preliminary vacuum chamber 6, the case 1 is discharged to the outside of the series of film forming units (see an arrow P5), and a waiting worker takes out all of the reflector base materials 2 from the case 1.

Then, the emptied case 1' is conveyed by a conveyer along a route bypassing the aluminum metallizing chamber 4 and the plasma polymerized film forming chamber 5 so that the emptied case 1' is returned to the start position I. Thereafter, the emptied case 1' can again house reflector base materials 2 in order to subject them to the film forming steps.

Figure 7:
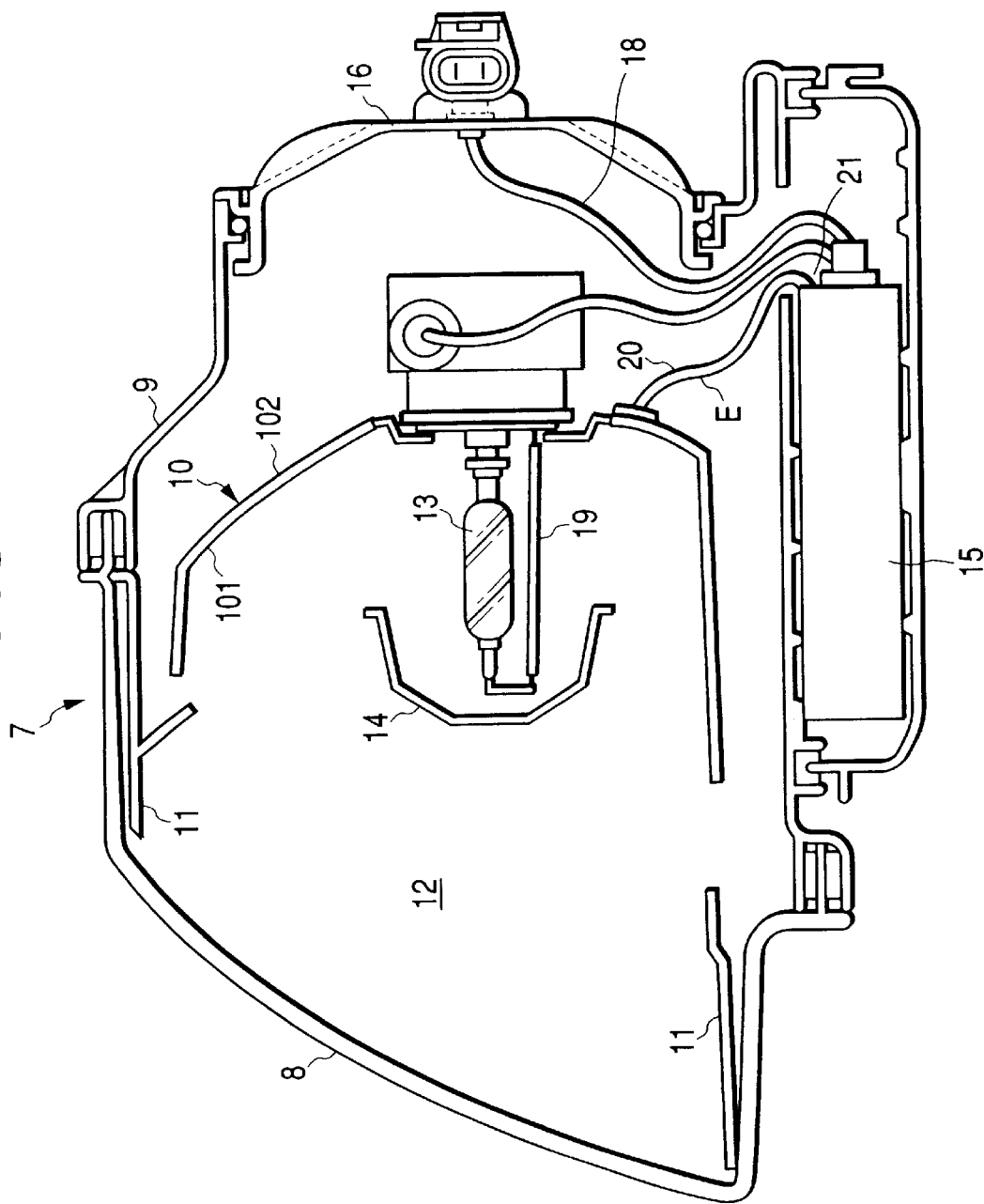
FIG. 7 is a simplified diagram illustrating an embodiment of the discharge headlamp.

An application of the reflector 10—obtained from the line-type film-forming method according to this embodiment of the invention—to an automotive discharge headlamp 7 will be described with reference to FIG. 7. FIG. 7 is a simplified diagram illustrating an embodiment of the discharge headlamp.

A parabolic reflector, as the reflector 10 obtained from the line-type film-forming method according to the invention, is mounted in a lamp chamber 12 in such a way that it is embraced by a plastic lamp body 9. The sectional structure of the reflector 10 is entirely similar to what is shown in FIG. 6. The plasma polymerized protective film is formed on the surface 101 of the reflector 10, whereas the aluminum metallized film 401b is exposed to the outside of the reflector on the back surface 102 thereof.

The aluminum metallized films 401b and/or 401a shield the electromagnetic waves discharged from a discharge lamp 13 that is arranged in such a manner as to be embraced by the reflector 10. The aluminum metallized film 401b is grounded E by utilizing the reflector's own back surface 102.

More specifically, a grounding line 20, connected to the aluminum metallized film 401b, is connected to a grounding terminal 21 provided on the edge face of a ballast 15 (having a built-in ballast circuit) that is disposed in the lower portion of the headlamp.

Reference number: 8, in FIG. 7, denotes a front lens fitted to a lamp body 9; 11 denotes an extension reflector for concealing the gap between the reflector 10 and the lamp body 9; 14 denotes a shade for concealing the discharge lamp 13; 16 denotes a back cover to be fitted to the rear top portion of the lamp body 9; 17 and 18 denote wiring cords; and 19 denotes a lead support for supporting the discharge lamp 13.

2. Effect of the Invention

The effect achievable by the line-type film-forming method is as follows:

The productivity is improved because the work required to follow the step of setting the synthetic-resin base materials can be simplified, and the lead time can also be shortened. Moreover, the steps of forming metallized aluminum, and plasma polymerized, films that have heretofore been separately followed can now be performed in series, whereby the work of conveying synthetic-resin base materials from the aluminum metallizing stage to the plasma polymerized film forming stage is unnecessary, which results in improving workability.

According to the present invention, films are formed while the case is laterally passed through an aluminum metallizing chamber and a plasma polymerized film forming chamber. Therefore, a complicated mechanism for rotating base materials in any metallized-film forming unit can be dispensed with, so that the maintenance and handling of the metallizing-film forming unit is made easy as well as with reduced manufacturing cost.

The case for housing the synthetic-resin base materials is re-cycled to the side of the aluminum metallizing chamber whereby it can be used repeatedly, so that the efficiency of workability is improved.

The pluralities of aluminum metallizing and plasma sources respectively are arranged in the lower regions of the aluminum metallizing and the plasma polymerized film forming chambers. With respect to aluminum, a metallized film is formed on both the front surface and back surface of each reflector base material by moving the aluminum around toward the back surface of the base material. In contrast, the silicone is restricted in its diffusing area, so that the silicone polymerized film is formed only on the front surface (the face directed downward) of each reflector base material. Because the aluminum metallized film has been formed on the back surface of the reflector thus obtained, it is ensured that an electromagnetic shielding function can be achieved. That is, since the aluminum metallized film is exposed to the back surface of the reflector, without being covered by a protective film, the back surface of the reflector can be grounded. Therefore, reflectors fit for use in automotive discharge headlamps can be provided.

The present invention is not limited to the specific above-described embodiment. It is contemplated that numerous modifications maybe made to the line-type film-forming method, and reflector formed thereby, of the present invention without departing from the spirit and scope of the invention as defined in the following claims.

What is claimed is:

1. A line-type film-forming method for forming aluminum metallized films and plasma polymerized protective films on a plurality of synthetic-resin base materials, comprising:
   placing the synthetic-resin base materials in a case; and
   moving the case successively through an aluminum metallizing chamber and a plasma polymerized film forming chamber.

2. The line-type film-forming method as claimed in claim 1, further comprising:
   sequentially forming the aluminum metallized films and the plasma polymerized protective films on the synthetic-resin base materials;
   removing the synthetic-resin base materials with the aluminum metallized films and the plasma polymerized protective films formed thereon from the case; and
   conveying an empty case to one side of the aluminum metallizing chamber so that the case can be used repeatedly.

3. The line-type film-forming method as claimed in claim 2, wherein each of the synthetic-resin base materials is a substantially cup-shaped reflector base material to be mounted in a vehicular lamp.

4. The line-type film-forming method as claimed in claim 3, further comprising:

laying the reflector base materials face down;

blowing aluminum from below each of the reflector base materials in the aluminum metallizing chamber to form the aluminum metallized films on both a front surface and a back surface of each of the reflector base materials; and forming the plasma polymerized films on only the front surface of each of the reflector base materials in the plasma polymerized film-forming chamber.

5. The line-type film-forming method as claimed in claim 1, wherein each of the synthetic-resin base materials is a substantially cup-shaped reflector base material to be mounted in a vehicular lamp.

6. The line-type film-forming method as claimed in claim 5, further comprising:

laying the reflector base materials face down;

blowing aluminum from below each of the reflector base materials in the aluminum metallizing chamber to form the aluminum metallized films on both a front surface and a back surface of each of the reflector base materials; and forming the plasma polymerized films on only the front surface of each of the reflector base materials in the plasma polymerized film-forming chamber.

* * * * *